(12) United States Patent
Zhang et al.

(10) Patent No.: US 10,283,729 B2
(45) Date of Patent: May 7, 2019

(54) ORGANIC LIGHT-EMITTING DIODE DISPLAY ELEMENT, ITS MANUFACTURING METHOD AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yuting Zhang, Beijing (CN); Chunwei Wu, Beijing (CN); Jianwei Yu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 15/129,992

(22) PCT Filed: Sep. 24, 2015

(86) PCT No.: PCT/CN2015/090499
§ 371 (c)(1),
(2) Date: Sep. 28, 2016

(87) PCT Pub. No.: WO2016/192255
PCT Pub. Date: Dec. 8, 2016

(65) Prior Publication Data
US 2017/0117499 A1    Apr. 27, 2017

(30) Foreign Application Priority Data
Jun. 1, 2015    (CN) .......................... 2015 1 0297822

(51) Int. Cl.
*H01L 51/52* (2006.01)
*H01L 27/32* (2006.01)
(Continued)

(52) U.S. Cl.
CPC ...... *H01L 51/5218* (2013.01); *H01L 27/3248* (2013.01); *H01L 27/3262* (2013.01);
(Continued)

(58) Field of Classification Search
CPC ............ H01L 51/5218; H01L 51/0023; H01L 27/3248; H01L 27/3262; H01L 51/5056; H01L 51/56
See application file for complete search history.

(56) References Cited

U.S. PATENT DOCUMENTS

2002/0190639 A1   12/2002   Yamada et al.
2004/0140757 A1   7/2004    Tyan et al.
(Continued)

FOREIGN PATENT DOCUMENTS

CN    1855526 A    11/2006
CN    1864283 A    11/2006
(Continued)

OTHER PUBLICATIONS

First Office Action for Chinese Application No. 201510297822.5, dated Jun. 22, 2017, 7 Pages.
(Continued)

*Primary Examiner* — Thanh T Nguyen
(74) *Attorney, Agent, or Firm* — Brooks Kushman P.C.

(57) ABSTRACT

An OLED display element, its manufacturing method and a display device are provided. The OLED display element includes a light-emitting pixel unit. The light-emitting unit includes an anode arranged above a base substrate, a cathode arranged opposite to the anode, and a micro cavity formed between the anode and the cathode. The micro cavity
(Continued)

includes an organic light-emitting layer, and the anode includes an ITO layer arranged opposite to the cathode and a metal oxide conductor layer arranged at a side of the ITO layer that is farther away from the cathode than the other side of the ITO layer.

18 Claims, 4 Drawing Sheets

(51) Int. Cl.
  *H01L 51/00* (2006.01)
  *H01L 51/50* (2006.01)
  *H01L 51/56* (2006.01)
(52) U.S. Cl.
  CPC ...... *H01L 51/0023* (2013.01); *H01L 51/5056* (2013.01); *H01L 51/5212* (2013.01); *H01L 51/5215* (2013.01); *H01L 51/5265* (2013.01); *H01L 51/56* (2013.01)

(56) References Cited

U.S. PATENT DOCUMENTS

| | | | |
|---|---|---|---|
| 2005/0073228 A1 | 4/2005 | Tyan et al. | |
| 2005/0285114 A1* | 12/2005 | Kang | H01L 51/5203 257/72 |
| 2006/0243976 A1 | 11/2006 | Shin | |
| 2008/0111477 A1* | 5/2008 | Kim | H01L 27/3272 313/504 |
| 2012/0176025 A1 | 7/2012 | Lee et al. | |
| 2014/0166999 A1* | 6/2014 | Kim | H01L 27/3258 257/40 |
| 2014/0175385 A1 | 6/2014 | Li et al. | |
| 2016/0276417 A1* | 9/2016 | Huang | H01L 27/3246 |

FOREIGN PATENT DOCUMENTS

| | | |
|---|---|---|
| CN | 102110783 A | 6/2011 |
| CN | 102157563 A | 8/2011 |
| CN | 102651455 A | 8/2012 |
| CN | 1003000638 A | 3/2013 |
| CN | 103441222 A | 12/2013 |
| EP | 1439589 A2 | 7/2004 |

OTHER PUBLICATIONS

International Search Report and Written Opinion for Application No. PCT/CN2015/090499, dated Feb. 24, 2016, 8 Pages.
Second Office Action for Chinese Application No. 201510297822.5, dated Jan. 16, 2018, 4 Pages.
Third Office Action for Chinese Application No. 201510297822.5, dated Jun. 26, 2018, 7 Pages.

\* cited by examiner

ORGANIC LIGHT-EMITTING DIODE DISPLAY ELEMENT, ITS MANUFACTURING METHOD AND DISPLAY DEVICE

CROSS-REFERENCE TO RELATED APPLICATION

This application is the U.S. national phase of PCT Application No. PCT/CN2015/090499 filed on Sep. 24, 2015, which claims priority to Chinese Application No. 201510297822.5 filed on Jun. 1, 2015, the disclosures of which are incorporated in their entirety by reference herein.

TECHNICAL FIELD

The present disclosure relates to the field of display technology, in particular to an organic light-emitting diode (OLED) display element, its manufacturing method and a display device.

BACKGROUND

OLED display element has attracted more and more attentions due to advantages such as self-luminescence, being rich-colored, rapid response, wide viewing angle, small weight and thickness, low power consumption, and being capable of achieving flexible display. In addition, a display device with the OLED display elements has a broad application prospect.

The OLED display element has a basic, sandwich-like structure consisting of an anode, a cathode and an organic light-emitting layer between the anode and the cathode. Usually, the anode is thin and transparent, and is an indium tin oxide (ITO) layer having a semiconductor characteristic, and the cathode is a metal layer or a metal oxide layer. In the case that a voltage is applied to the OLED display element, electron holes from the anode may be combined with electrons from the cathode at the light emitting layer, so as to enable the OLED display element to emit light through the anode or cathode. However, due to the limit of its structure, the luminous intensity and the luminous efficiency of the OLED display element are relatively low.

SUMMARY

An object of the present disclosure is to provide an OLED display element, so as to improve the luminous intensity and the luminous efficiency of the OLED display element.

In one aspect, the present disclosure provides in some embodiments an OLED display element, including a light-emitting pixel unit. The light-emitting pixel unit includes an anode arranged above a base substrate, a cathode arranged opposite to the anode, and a micro cavity formed between the anode and the cathode. The micro cavity includes an organic light-emitting layer, and the anode includes an ITO layer arranged opposite to the cathode and a metal oxide conductor layer arranged at a side of the ITO layer that is farther away from the cathode than the other side of the ITO layer.

According to the OLED display element in the embodiments of the present disclosure, the anode of the light-emitting pixel unit includes the ITO layer and the metal oxide conductor layer. In the case that a voltage is applied to the OLED display element, holes in the ITO layer and the metal oxide conductor layer and electrons in the cathode are transported to the organic light-emitting layer. The holes and the electrons meet in the organic light-emitting layer, so as to excite the organic light-emitting layer to generate photons in various energy states, thereby to generate light beams. The photons in various energy states are reallocated in the micro cavity between the anode and the cathode, so that the light beam transmitted from the organic light emitting layer and having a wavelength in conformity with a resonant cavity mode may be transmitted to an exterior of the OLED display element, thereby the OLED display element starts to emit light. As compared with the prior art where merely the ITO layer is used as the anode of the light-emitting pixel unit, in the embodiments of the present disclosure, the ITO layer and the metal oxide conductor layer are used as the anode of the light-emitting pixel unit. A cavity length of the micro cavity may be adjusted, so as to improve a micro cavity effect of the OLED display element. In addition, due to the fact that the anode is formed by the ITO layer and the metal oxide conductor layer, it is able to improve a work function of the anode and increase the luminous intensity of a light beam having a specific wavelength, thereby to improve the luminous intensity and the luminous efficiency of the OLED display element. Further, due to the micro cavity between the cathode and the anode made by the ITO layer and the metal oxide conductor layer, it is able to narrow a full width at half maximum (FWHM) of the light beam from the OLED display element, i.e., to acquire a narrowed spectrum, and prevent the light beams in different colors from interfering with each other, thereby to improve color purity of the OLED display element.

In another aspect, the present disclosure provides in some embodiments a display device including the above-mentioned OLED display element, so as to improve the luminous intensity and the luminous efficiency of the OLED display element.

The advantages of the display device are identical to those of the above-mentioned OLED display element, and thus will not be particularly defined herein.

In yet another aspect, the present disclosure provides in some embodiments a method for manufacturing the above-mentioned OLED display element, so as to improve the luminous intensity and the luminous efficiency of the OLED display element. The method includes steps of providing a base substrate, and forming an anode, a micro cavity and a cathode sequentially above the base substrate. The micro cavity includes an organic light-emitting layer, and the anode includes a metal oxide conductor layer and an ITO layer adjacent to the micro cavity.

The advantages of the method are identical to those of the above-mentioned OLED display element, and thus will not be particularly defined herein.

BRIEF DESCRIPTION OF THE DRAWINGS

The drawings herein are incorporated into, and constitute a part of, the specification. The embodiments of the present disclosure are for illustrative purposes only, but shall not be used to limit the scope of the present disclosure. In the drawings.

Figure 1:
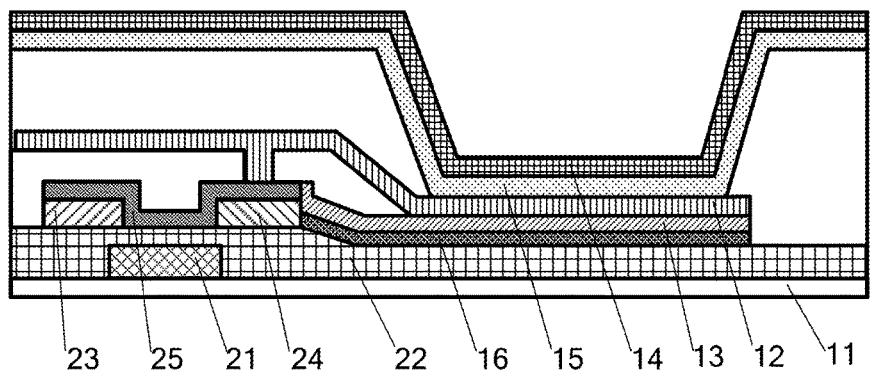
FIG. 1 is a schematic view showing an OLED display element according to one embodiment of the present disclosure.

REFERENCE SIGN LIST 11 base substrate
12 ITO layer
13 metal oxide conductor layer
14 cathode
15 micro cavity
16 auxiliary metal layer
21 gate electrode
22 gate insulation layer
23 source electrode
24 drain electrode
25 active layer
151 hole injection layer
152 hole transport layer
153 organic light-emitting layer
154 electron injection layer
155 electron transport layer

DETAILED DESCRIPTION OF THE EMBODIMENTS

It will describe an OLED display element, its manufacturing method and a display device hereinafter in conjunction with the drawings and embodiments.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 2:
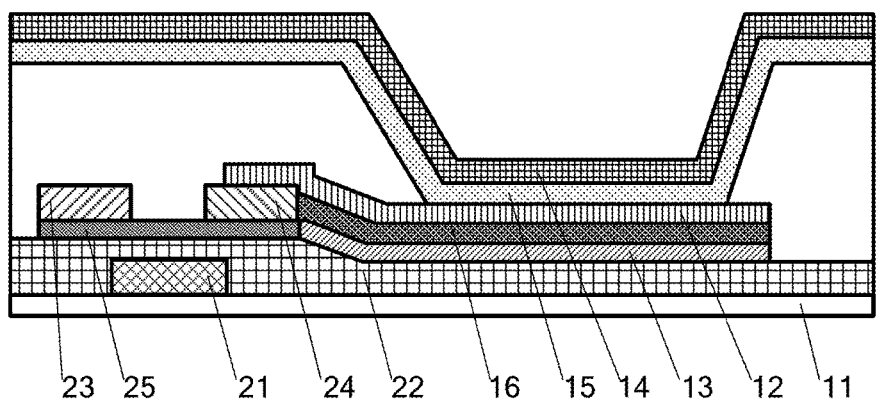
FIG. 2 is a schematic view showing another OLED display device according to one embodiment of the present disclosure.

Referring to FIG. 1 or 2, the present disclosure provides in some embodiments an OLED display element, which includes a light-emitting pixel unit. The light-emitting pixel unit includes an anode arranged above a base substrate 11, a cathode 14 arranged opposite to the anode, and a micro cavity 15 formed between the anode and the cathode 14. The micro cavity 15 includes an organic light-emitting layer, and the anode includes an ITO layer 12 arranged opposite to the cathode 14 and a metal oxide conductor layer 13 arranged at a side of the ITO layer 12 that is farther away from the cathode 14 than the other side of the ITO layer 12.

According to the OLED display element in the embodiments of the present disclosure, the anode of the light-emitting pixel unit includes the ITO layer 12 and the metal oxide conductor layer 13. In the case that a voltage is applied to the OLED display element, holes in the ITO layer 12 and the metal oxide conductor layer 13 and electrons in the cathode 14 are transported to the organic light-emitting layer. The holes and the electrons meet in the organic light-emitting layer, so as to excite the organic light-emitting layer to generate photons in various energy states, thereby to generate light beams. The photons in various energy states are reallocated in the micro cavity between the anode and the cathode 14, so that a light beam having a wavelength in conformity with a resonant cavity mode may be transmitted to an exterior of the OLED display element, thereby the OLED display element starts to emit light. As compared with the prior art where merely the ITO layer 12 is used as the anode of the light-emitting pixel unit, in the embodiments of the present disclosure, the ITO layer 12 and the metal oxide conductor layer 13 are used as the anode of the light-emitting pixel unit. A cavity length of the micro cavity 15 between the anode and the cathode 14 (i.e. a distance between a surface of the cathode 14 facing the micro cavity 15 and a surface of the anode facing the micro cavity 15) may be adjusted, so as to improve a micro cavity effect of the OLED display element. In addition, due to the fact that the anode is formed by the ITO layer 12 and the metal oxide conductor layer 13, it is able to improve a work function of the anode and increase the luminous intensity of a light beam transmitted from the organic light emitting layer and having a specific wavelength, thereby to improve the luminous intensity and the luminous efficiency of the OLED display element. Further, due to the fact that the micro cavity 15 is formed between the cathode 14 and the anode formed by the ITO layer 12 and the metal oxide conductor layer 13, it is able to narrow an FWHM of the light beam from the OLED display element, i.e., to acquire a narrowed spectrum, and prevent the light beams in different colors from interfering with each other, thereby to improve color purity of the OLED display element.

It should be appreciated that, the cathode may be made of a metal or a metal oxide. Usually, in the case that a bottom-emission OLED display element is to be manufactured, the cathode may be made of a metal having high reflectivity or a metal oxide having reflectivity higher than the anode, so as to enable the light beams from the OLED display element to be transmitted through the anode. In the case that a top-emission OLED display element is to be manufactured, the cathode may be made of a transparent or semi-transparent metal oxide, and the reflectivity of the anode may be increased, so as to enable the light beams from the OLED display element to be transmitted through the cathode.

In the case of manufacturing a color display device including the OLED display element, a plurality of light-emitting pixel units is arranged on the base substrate 11, and each light-emitting pixel unit includes at least one red (R) pixel unit, at least one blue (B) pixel unit and at least one green (G) pixel unit. The micro cavities for the R, G and B pixel units have different cavity lengths. In order to improve the color purity of the light beam from the OLED display element, the anodes of the R, G and B pixel units may include, or not include, the metal oxide conductor layer 13 according to the practical need.

Referring again to FIG. 1 or 2, in the embodiments of the present disclosure, the OLED display element further includes a thin film transistor (TFT) arranged on the base substrate 11. The TFT includes a gate electrode 21 arranged on the base substrate 11, a gate insulation layer 22 covering the base substrate 11 and the gate electrode 21, and a source electrode 23, a drain electrode 24 and an active layer 25 arranged above the gate insulation layer 22. The source electrode 23 and the drain electrode 24 are arranged at an identical layer and separated from each other, and the drain electrode 24 is connected to the anode. The metal oxide conductor layer 13 of the anode of the light-emitting pixel unit is arranged between the ITO layer 12 of the anode and the gate insulation layer 22. The TFT, as a switch for the light-emitting pixel unit, is configured to control the light-emitting pixel unit to emit light.

In the embodiments of the present disclosure, the active layer 25 and the metal oxide conductor layer 13 may be each made of a metal oxide. The metal oxide forming the active layer 25 may be identical to, or different from, the metal oxide forming the metal oxide conductor layer 13. In order to reduce process steps for forming the OLED display element, preferably, as shown in FIG. 1 or 2, the metal oxide conductor layer 13 of the light-emitting pixel unit is arranged at a layer identical to the active layer 25 of the TFT. The metal oxide conductor layer 13 may be formed by subjecting to the metal oxide deposited in the light-emitting pixel unit to ion surface treatment. In this way, it is able to form the metal oxide conductor layer 13 and the active layer 25 through a single patterning process, so as to reduce the process steps as well as the number of mask plates to be used, thereby to reduce the time for manufacturing the OLED display element as well as the production cost. A thickness of the metal oxide conductor layer 13 may be adjusted through a halftone mask plate, so as to adjust the cavity length of the micro cavity 15. As a result, it is able to improve a micro cavity effect of the OLED display element and acquire a narrowed spectrum, thereby to improve the luminous intensity and the luminous efficiency of the OLED display element, and improve the color purity of the light beam from the OLED display element.

The active layer 25 and the metal oxide conductor layer 13 may be made of one of various materials, e.g., indium gallium zinc oxide (IGZO), indium zinc oxide (IZO) or zinc oxide (ZnO). It should be appreciated that, after patterns of the active layer 25 and the metal oxide conductor layer 13 are formed above the base substrate 11, a surface of the metal oxide conductor layer 13 may be subjected to ion surface treatment, so as to improve the conductivity of the metal oxide conductor layer 13. The active layer 25 may be connected to, or separated from, the metal oxide conductor layer 13.

Referring to FIG. 1 or 2, the anode of the light-emitting pixel unit may further include an auxiliary metal layer 16 arranged between the ITO layer 12 of the anode and the gate insulation layer 22, the auxiliary metal layer 16 is arranged on the metal oxide conductor layer 13, or the metal oxide conductor layer 13 is arranged on the auxiliary metal layer 16. The auxiliary metal layer 16 may be arranged at the anode. A thickness of the auxiliary metal layer 16 may be adjusted so as to adjust a cavity length of the micro cavity 15. As a result, it is able to improve the micro cavity effect of the OLED display element and acquire the narrowed spectrum, thereby to increase the luminous intensity and the luminous efficiency of the OLED display element and improve the color purity of the light beam from the OLED display element. In addition, through the auxiliary metal layer 16 arranged at the node, it is able to adjust a thickness of the anode and thus adjust the cavity length of the micro cavity 16, thereby to improve the micro cavity effect of the OLED display element. As a result, the OLED display element with good micro cavity effect may be implemented by adjusting the thickness of the auxiliary metal layer 16. Further, in the case that the OLED display element is a top-emission OLED display element, through the auxiliary metal layer 16 arranged at the anode, it is able to increase the reflectivity of the anode, thereby to improve the luminous intensity and the luminous efficiency of the OLED display element.

The auxiliary metal layer 16 may be arranged separately, or arranged at a layer identical to the source electrode 23 and the drain electrode 24. Optionally, referring again to FIG. 1 or 2, the auxiliary metal layer 16 is arranged at a layer, and made of a material, identical to the source electrode 23 and the drain electrode 24. In this way, it is able to form the source electrode 23, the drain electrode 24 and the auxiliary metal layer 16 through a single patterning process, so as to reduce the processing steps for forming the OLED display element and the number of the used mask plates, thereby to reduce the production time and the production cost. It should be appreciated that, the auxiliary metal layer 16 may be connected to, or separated from, the drain electrode 24. In the case that the auxiliary metal layer 16 is connected to the drain electrode 24, the anode of the light-emitting pixel unit is connected to the drain electrode 24. At this time, the ITO layer 12 of the anode may be connected to the drain electrode 24 not through a via-hole above the drain electrode 24, i.e., it is unnecessary to provide any via-hole above the drain electrode 24. As a result, it is able to reduce the process steps for forming the OLED display element and the number of the used mask plates, thereby to reduce the time and the cost for producing the OLED display element.

For the light-emitting pixel unit of the LED display element, the metal oxide conductor layer 13 and the auxiliary metal layer 16 of the anode may be formed in an order in accordance with an order of a step of forming the active layer 25 and a step of forming the source electrode 23 and the drain electrode 24 of the TFT. During the implementation, there exist the following two ways for forming the metal oxide conductor layer 13 and the auxiliary metal layer 16 of the anode.

In one way, referring to FIG. 1, in the TFT, the source electrode 23 and the drain electrode 24 are arranged on the gate insulation layer 22, and the active layer 25 is arranged on the source electrode 23, the drain electrode 24 and a channel between the source electrode 23 and the drain electrode 24. In the light-emitting pixel unit, the auxiliary metal layer 26 is arranged on the gate insulation layer 22, and the metal oxide conductor layer 13 is arranged on the auxiliary metal layer 16. In this way, it is able to prevent the active layer 25 from being in contact with an etchant in the case that the patterns of the source electrode 23 and the drain electrode 24 are formed on the active layer 25, thereby to prevent the active layer 25 from being etched by the etchant and prevent the characteristics of the TFT from being adversely affected.

In another way, referring to FIG. 2, in the TFT, the active layer 25 is arranged on the gate insulation layer 22, and the source electrode 23 and the drain electrode 24 are arranged on the active layer 25. In the light-emitting pixel unit, the metal oxide conductor layer 13 is arranged on the gate insulation layer 22, and the auxiliary metal layer 16 is arranged on the metal oxide conductor layer 13. It is not necessary to arrange an oxide insulation layer between the drain electrode 24 and the ITO layer 12 of the anode, so one end of the ITO layer 12 of the anode may be directly formed on the drain electrode 24, so that the ITO layer 12 of the anode is directly connected to the drain electrode 24. As a result, it is not necessary to form above the drain electrode 24 the via-hole through which the ITO layer 12 may be connected to the drain electrode 24, so as to reduce the process steps for manufacturing the OLED display element and the number of the used mask plates, thereby to reduce the time and the cost for manufacturing the OLED display device.

Figure 3:
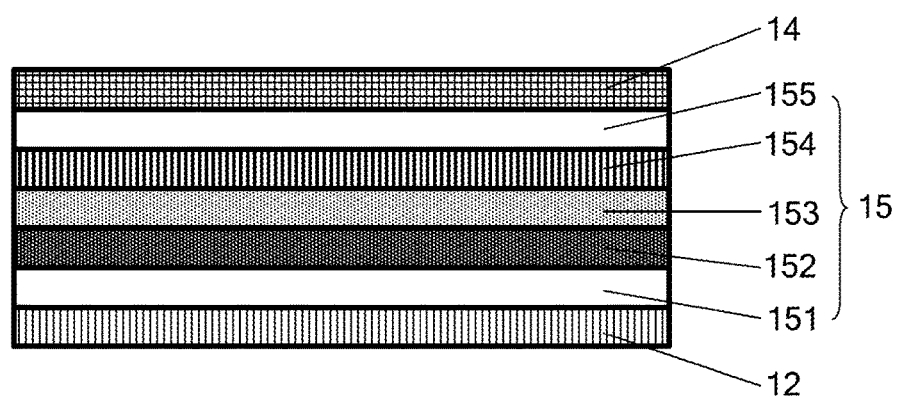
FIG. 3 is a schematic view showing a micro cavity according to one embodiment of the present disclosure.

In the embodiments of the present disclosure, in order to adjust the cavity length of the micro cavity 15 of the light-emitting pixel unit conveniently, referring to FIG. 3, the micro cavity 15 further includes a hole injection layer 151 and a hole transport layer 152 arranged between the hole injection layer 151 and an organic light-emitting layer 153, and an electron injection layer 155 and an electron transport layer 154 arranged between the cathode 14 and the organic light-emitting layer 153. The hole transport layer 152 is arranged between the organic light-emitting layer 153 and the hole injection layer 151, and the electron transport layer 154 is arranged between the organic light-emitting layer 153 and the electron injection layer 155. In this way, it is able to adjust the cavity length of the micro cavity 15 by adjusting thicknesses of the hole injection layer 151, the hole transport layer 152, the electron injection layer 155, the electron transport layer 154 and/or the organic light-emitting layer 153. As a result, it is able to improve the micro cavity effect of the OLED display element and acquire the narrowed spectrum, thereby to increase the luminous intensity and the luminous efficiency of the OLED display element and improve the color purity of the light beam from the OLED display element.

The present disclosure further provides in some embodiments a display device including the above-mentioned OLED display element.

The advantages of the display device are identical to those of the above-mentioned OLED display element, and thus will not be particularly defined herein.

The display device may be any product or member having a display function, such as an electronic paper, a mobile phone, a flat-panel computer, a television, a laptop computer, a digital photo frame or a navigator.

Figure 4:
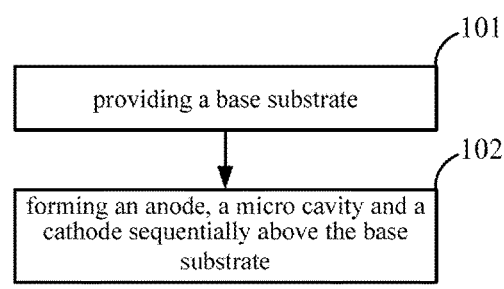
FIG. 4 is a flow chart of a method for manufacturing the OLED display element according to one embodiment of the present disclosure.

Referring to FIG. 4, the present disclosure further provides in some embodiments a method for manufacturing the above-mentioned OLED display element. The method includes: Step 101 of providing the base substrate; and Step 102 of forming the anode, the micro cavity and the cathode sequentially above the base substrate. The micro cavity includes the organic light-emitting layer. The anode includes the ITO layer arranged opposite to the cathode, and the metal oxide conductor layer arranged between the ITO layer and the base substrate.

The advantages of the method are identical to those of the above-mentioned OLED display element, and thus will not be particularly defined herein.

In the embodiments of the present disclosure, prior to the step of forming the anode, the micro cavity and the cathode sequentially above the base substrate, the method further includes forming the gate electrode and the gate insulation layer on the base substrate, and forming the active layer, the source electrode and the drain electrode above the gate insulation layer. The source electrode and the drain electrode may be arranged at an identical layer and separated from each other. The drain electrode is connected to the anode. The metal oxide conductor layer of the anode is arranged between the ITO layer of the anode and the gate insulation layer.

In the embodiments of the present disclosure, the metal oxide conductor layer of the light-emitting pixel unit is arranged at a layer identical to the active layer of the TFT. The metal oxide conductor layer may be formed by subjecting the metal oxide deposited in the light-emitting pixel unit to ion surface treatment.

In the embodiments of the present disclosure, the anode of the light-emitting pixel unit further includes the auxiliary metal layer arranged between the ITO layer of the anode. The auxiliary metal layer is arranged on the metal oxide conductor layer, or the metal oxide conductor layer is arranged on the auxiliary metal layer. The auxiliary metal layer may be arranged at a layer identical to the source electrode and the drain electrode.

In the embodiments of the present disclosure, in the TFT, the source electrode and the drain electrode are arranged on the gate insulation layer, and the active layer is arranged on the source electrode, the drain electrode, and the channel between the source electrode and the drain electrode. In the light-emitting pixel unit, the auxiliary metal layer is arranged on the gate insulation layer, and the metal oxide conductor layer is arranged on the auxiliary metal layer.

Alternatively, in the TFT, the active layer is arranged on the gate insulation layer, and the source electrode and the drain electrode are arranged on the active layer. In the light-emitting pixel unit, the metal oxide conductor layer is arranged on the gate insulation layer, and the auxiliary metal layer is arranged on the metal oxide conductor layer.

Figure 5:
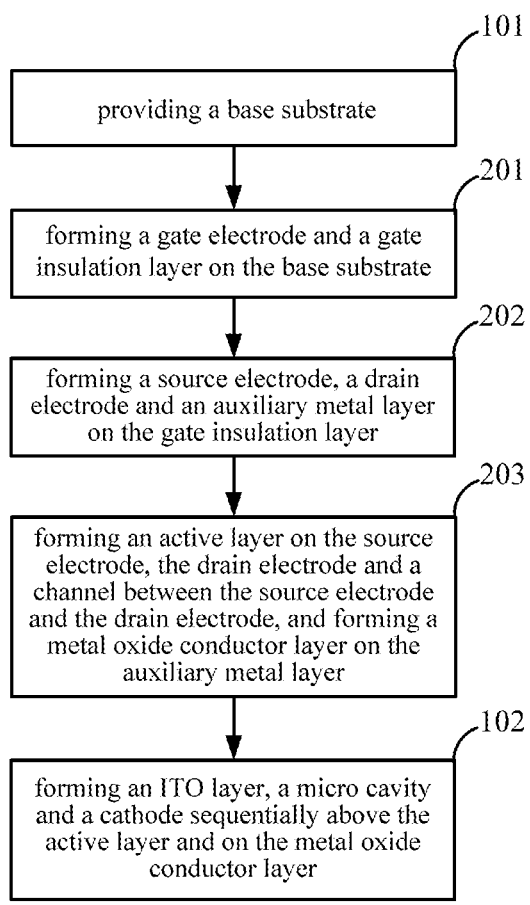
FIG. 5 is a flow chart of another method for manufacturing the OLED display element according to one embodiment of the present disclosure.

During the implementation, referring to FIG. 5, the active layer of the TFT is arranged on the source electrode, the drain electrode and the channel between the source electrode and the drain electrode. In the case that the metal oxide conductor layer of the light-emitting pixel unit is arranged on the auxiliary metal layer, the method includes: Step 101 of providing the base substrate; Step 201 of forming the gate electrode and the gate insulation layer on the base substrate; Step 202 of forming the source electrode, the drain electrode and the auxiliary metal layer on the gate insulation layer; Step 203 of forming the active layer on the source electrode, the drain electrode, and the channel between the source electrode and the drain electrode, and forming the metal oxide conductor layer on the auxiliary metal layer; and Step 102 of forming the ITO layer, the micro cavity and the cathode sequentially above the active layer and on the metal oxide conductor layer.

Figure 6:
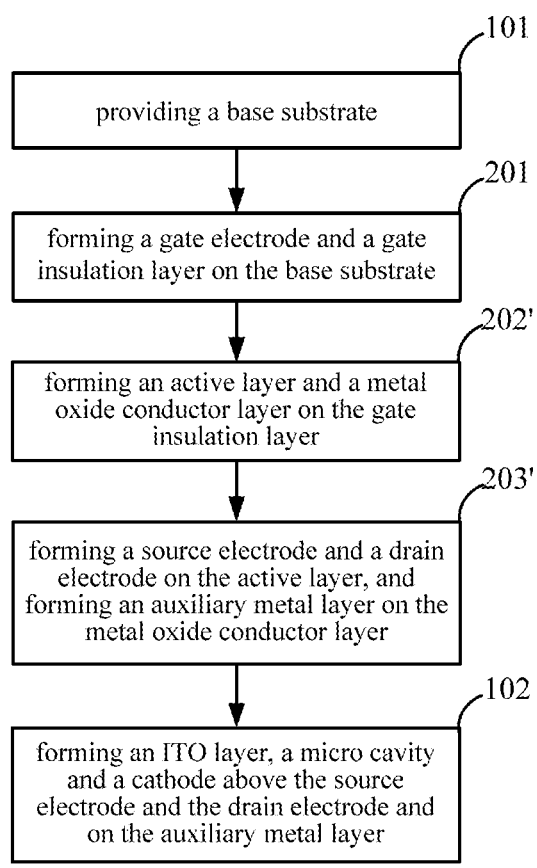
FIG. 6 is a flow chart of yet another method for manufacturing the OLED display element according to one embodiment of the present disclosure.

Referring to FIG. 6, in the case that the source electrode and the drain electrode of the TFT are arranged on the active layer, and the auxiliary metal layer of the light-emitting pixel unit is arranged on the metal oxide conductor layer, the method includes: Step 101 of providing the base substrate; Step 201 of forming the gate electrode and the gate insulation layer on the base substrate; Step 202' of forming the active layer and the metal oxide conductor layer on the gate insulation layer; Step 203' of forming the source electrode and the drain electrode on the active layer, and forming the auxiliary metal layer on the metal oxide conductor layer; and Step 102 of forming the ITO layer, the micro cavity and the cathode sequentially above the source electrode and the drain electrode and on the auxiliary metal layer.

The above features, structures, materials and features may be combined in any appropriate manner in one or more embodiments.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An organic light-emitting diode (OLED) display element, comprising a light-emitting pixel unit, wherein the light-emitting pixel unit comprises an anode arranged above a base substrate, a cathode arranged opposite to the anode, a thin film transistor (TFT) arranged on the base substrate, and a micro cavity formed between the anode and the cathode, the TFT comprises a gate electrode arranged on the base substrate, a gate insulation layer covering the base substrate and the gate electrode, a source electrode, and a drain electrode, the micro cavity comprises an organic light-emitting layer, and the anode comprises an indium tin oxide (ITO) layer, a metal oxide conductor layer, and an auxiliary metal layer arranged between the ITO layer of the anode and the gate insulation layer, the auxiliary metal layer, the source electrode and the drain electrode are made of an identical material, the ITO layer is arranged opposite to the cathode, and the metal oxide conductor layer is arranged at a side of the ITO layer that is farther away from the cathode than the other side of the ITO layer, wherein a first surface of a portion of the ITO layer is in direct contact with the micro cavity, a second surface of the portion of the ITO layer is in direct contact with a third surface of the auxiliary metal layer, a fourth surface of the auxiliary metal layer is in direct contact with the metal oxide conductor layer, the first surface is opposite to the second surface, the third surface is opposite to the fourth surface, an area of an orthogonal projection of the auxiliary metal layer onto the base substrate is smaller than an area of an orthogonal projection of the ITO layer onto the base substrate, the orthogonal projection of the auxiliary metal layer onto the base substrate is within the orthogonal projection of the ITO layer onto the base substrate, and an orthogonal projection of the first surface onto the base substrate coincides with an orthogonal projection of the second surface onto the base substrate.

2. The OLED display element according to claim 1, wherein
the TFT further comprises:
an active layer,
wherein the active layer, the source electrode and the drain electrode are arranged above the gate insulation layer,
the source electrode and the drain electrode are arranged at an identical layer and separated from each other, and the drain electrode is connected to the anode; and
the metal oxide conductor layer of the anode is arranged between the ITO layer of the anode and the gate insulation layer.

3. The OLED display element according to claim 2, wherein the metal oxide conductor layer of the light-emitting pixel unit and the active layer of the TFT are arranged at an identical layer.

4. The OLED display element according to claim 3, wherein the micro cavity further comprises:
a hole injection layer and a hole transport layer arranged between the ITO layer of the anode and the organic light-emitting layer, the hole transport layer being arranged between the organic light-emitting layer and the hole injection layer; and
an electron injection layer and an electron transport layer arranged between the cathode and the organic light-emitting layer, the electron transport layer being arranged between the organic light-emitting layer and the electron injection layer.

5. The OLED display element according to claim 2, wherein the metal oxide conductor layer is formed by subjecting metal oxide deposited in the light-emitting pixel unit to ion surface treatment.

6. The OLED display element according to claim 2, wherein the micro cavity further comprises:
a hole injection layer and a hole transport layer arranged between the ITO layer of the anode and the organic light-emitting layer, the hole transport layer being arranged between the organic light-emitting layer and the hole injection layer; and
an electron injection layer and an electron transport layer arranged between the cathode and the organic light-emitting layer, the electron transport layer being arranged between the organic light-emitting layer and the electron injection layer.

7. The OLED display element according to claim 1, wherein the auxiliary metal layer, the source electrode and the drain electrode are arranged at an identical layer.

8. The OLED display element according to claim 7, wherein
in the TFT, the source electrode and the drain electrode are arranged on the gate insulation layer, and an active layer is arranged on the source electrode, the drain electrode and a channel between the source electrode and the drain electrode; and
in the light-emitting pixel unit, the auxiliary metal layer is arranged on the gate insulation layer, and the metal oxide conductor layer is arranged on the auxiliary metal layer.

9. The OLED display element according to claim 7, wherein
in the TFT, an active layer is arranged on the gate insulation layer, and the source electrode and the drain electrode are arranged on the active layer; and
in the light-emitting pixel unit, the metal oxide conductor layer is arranged on the gate insulation layer, and the auxiliary metal layer is arranged on the metal oxide conductor layer.

10. The OLED display element according to claim 1, wherein the auxiliary metal layer is connected to the drain electrode.

11. The OLED display element according to claim 1, wherein the micro cavity further comprises:
a hole injection layer and a hole transport layer arranged between the ITO layer of the anode and the organic light-emitting layer, the hole transport layer being arranged between the organic light-emitting layer and the hole injection layer; and
an electron injection layer and an electron transport layer arranged between the cathode and the organic light-emitting layer, the electron transport layer being arranged between the organic light-emitting layer and the electron injection layer.

12. A display device, comprising the OLED display element according to claim 1.

13. A method for manufacturing the OLED display element according to claim 1, comprising:
providing the base substrate; and
forming the anode, the micro cavity and the cathode sequentially above the base substrate,
wherein the ITO layer is arranged opposite to the cathode, and the metal oxide conductor layer is arranged between the ITO layer and the base substrate.

14. The method according to claim 13, wherein prior to the step of forming the anode, the micro cavity and the cathode sequentially above the base substrate, the method further comprises:
- forming the gate electrode and the gate insulation layer on the base substrate; and
- forming an active layer, the source electrode and the drain electrode above the gate insulation layer,
- wherein the source electrode and the drain electrode are arranged at an identical layer and separated from each other, and the drain electrode is connected to the anode, and
- the metal oxide conductor layer of the anode is arranged between the ITO layer of the anode and the gate insulation layer.

15. The method according to claim 14, wherein the metal oxide conductor layer of the light-emitting pixel unit and the active layer of the TFT are arranged at an identical layer.

16. The method according to claim 14, wherein the metal oxide conductor layer is formed by subjecting metal oxide deposited in the light-emitting pixel unit to ion surface treatment.

17. The method according to claim 14, wherein
the auxiliary metal layer, the source electrode and the drain electrode are arranged at an identical layer.

18. The method according to claim 17, wherein
in the TFT, the source electrode and the drain electrode are arranged on the gate insulation layer, and the active layer is arranged on the source electrode, the drain electrode, and a channel between the source electrode and the drain electrode; in the light-emitting pixel unit, the auxiliary metal layer is arranged on the gate insulation layer, and the metal oxide conductor layer is arranged on the auxiliary metal layer; or in the TFT, the active layer is arranged on the gate insulation layer, and the source electrode and the drain electrode are arranged on the active layer; in the light-emitting pixel unit, the metal oxide conductor layer is arranged on the gate insulation layer, and the auxiliary metal layer is arranged on the metal oxide conductor layer.

* * * * *